United States Patent
Hsu

(10) Patent No.: US 12,527,029 B2
(45) Date of Patent: Jan. 13, 2026

(54) TRENCH POWER SEMICONDUCTOR COMPONENT AND METHOD FOR MANUFACTURING THE SAME

(71) Applicant: SUPER GROUP SEMICONDUCTOR CO., LTD., Hsinchu County (TW)

(72) Inventor: Hsiu-Wen Hsu, Hsinchu County (TW)

(73) Assignee: SUPER GROUP SEMICONDUCTOR CO., LTD., Hsinchu County (TW)

( * ) Notice: Subject to any disclaimer, the term of this patent is extended or adjusted under 35 U.S.C. 154(b) by 600 days.

(21) Appl. No.: 17/858,399

(22) Filed: Jul. 6, 2022

(65) Prior Publication Data

US 2023/0170412 A1    Jun. 1, 2023

(30) Foreign Application Priority Data

Nov. 26, 2021   (TW) .................................. 110144101

(51) Int. Cl.
*H10D 30/66*    (2025.01)
*H10D 30/01*    (2025.01)
*H10D 64/00*    (2025.01)

(52) U.S. Cl.
CPC ....... *H10D 30/668* (2025.01); *H10D 30/0297* (2025.01); *H10D 64/117* (2025.01)

(58) Field of Classification Search
CPC .................................................... H10D 30/668
See application file for complete search history.

(56) References Cited

U.S. PATENT DOCUMENTS

| | | | | |
|---|---|---|---|---|
| 2010/0006928 A1* | 1/2010 | Pan | ...................... | H10D 30/668 |
| | | | | 257/E21.409 |
| 2010/0187602 A1* | 7/2010 | Woolsey | ........... | H01L 21/76202 |
| | | | | 257/330 |
| 2011/0089485 A1 | 4/2011 | Gao et al. | | |
| 2016/0163805 A1* | 6/2016 | Lee | ...................... | H10D 62/103 |
| | | | | 438/270 |
| 2018/0226480 A1 | 8/2018 | Okuda et al. | | |
| 2019/0006479 A1* | 1/2019 | Hsu | ...................... | H10D 30/668 |
| 2019/0006489 A1* | 1/2019 | Hsu | ...................... | H10D 64/513 |

FOREIGN PATENT DOCUMENTS

| | | |
|---|---|---|
| CN | 109216449 A | 1/2019 |
| CN | 109585547 A | 4/2019 |

\* cited by examiner

*Primary Examiner* — Minsun O Harvey
*Assistant Examiner* — Stephen Sutton Kotter
(74) *Attorney, Agent, or Firm* — Li & Cai Intellectual Property (USA) Office

(57) ABSTRACT

A trench power semiconductor component and a method for manufacturing the same are provided. The trench power semiconductor component includes an epitaxial layer having a trench, a bottom insulating layer, a gate insulating layer, a shielding electrode disposed in the trench, a gate, and a separation structure that includes a covering portion and a spacer portion. The gate is disposed on and separated from the shielding electrode by the separation structure. The covering portion covers a top portion of the shielding electrode and the bottom insulating layer, is connected to the gate insulating layer, and defines a recessed region. The spacer portion is disposed in the recessed region, and includes a main filling portion that closes off the recessed region and a first barrier portion located between the main filling portion and the covering portion. The main filling and the first barrier portion are made of different materials.

6 Claims, 14 Drawing Sheets

TRENCH POWER SEMICONDUCTOR COMPONENT AND METHOD FOR MANUFACTURING THE SAME

CROSS-REFERENCE TO RELATED PATENT APPLICATION

This application claims the benefit of priority to Taiwan Patent Application No. 110144101, filed on Nov. 26, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power semiconductor component and a method for manufacturing the same, and more particularly to a trench power semiconductor component that includes a shielding electrode and a method for manufacturing the same.

BACKGROUND OF THE DISCLOSURE

Work loss of a conventional trench power metal-oxide-semiconductor field-effect transistor (MOSFET) can be divided into switching loss and conducting loss. In order to reduce a gate-to-drain capacitance (Cgd) and thereby decrease the switching loss, the conventional trench power metal-oxide-semiconductor field-effect transistor includes a shielding electrode that is disposed in a lower half of a gate trench.

During a manufacturing process of the conventional trench power metal-oxide-semiconductor field-effect transistor, a gate is directly formed after a gate oxide layer and an interelectrode dielectric layer that is used to separate the shielding electrode and the gate are formed through a thermal oxidation process. However, the interelectrode dielectric layer that is formed by the thermal oxidation process has a small thickness in partial regions thereof. In addition, since sharp protrusions are formed at a top end of the shielding electrode and a bottom end of the gate, electric charges can easily be accumulated thereon so that an electric field is increased. In this way, a withstand voltage between the gate and the shielding electrode can be insufficient or a leakage current may be generated, such as to negatively affect component reliability.

SUMMARY OF THE DISCLOSURE

In response to the above-referenced technical inadequacies, the present disclosure provides a trench power semiconductor component and a method for manufacturing the same, so as to prevent formation of sharp protrusions at a top end of a shielding electrode and a bottom end of a gate and improve component reliability.

In one aspect, the present disclosure provides a trench power semiconductor component, which includes an epitaxial layer, a bottom insulating layer, a gate insulating layer, a shielding electrode, a gate, and a separation structure. The epitaxial layer has at least one trench. The bottom insulating layer and the gate insulating layer cover a lower inner wall surface and an upper inner wall surface of the at least one trench, respectively. The shielding electrode is disposed in the at least one trench, and the bottom insulating layer surrounds the shielding electrode. The gate is disposed on the shielding electrode, and is separated from the epitaxial layer by the gate insulating layer. The separation structure is disposed between the gate and the shielding electrode, and includes a covering portion and a spacer portion. The covering portion covers a top portion of the shielding electrode and the bottom insulating layer, and is connected to the gate insulating layer. The covering portion defines at least one recessed region. The spacer portion is disposed in the at least one recessed region, and includes a first barrier portion and a main filling portion. The first barrier portion is interposed between the main filling portion and the covering portion. The main filling portion closes off the at least one recessed region, and the main filling portion and the first barrier portion are respectively made of different materials.

In another aspect, the present disclosure provides a method for manufacturing a trench power semiconductor component. The method includes the following steps: forming a trench in an epitaxial layer; forming a bottom insulating layer and a shielding electrode in the trench, in which the bottom insulating layer covers a lower inner wall surface of the trench, and a top portion of the shielding electrode protrudes from a top surface of the bottom insulating layer; forming a separation structure on the shielding electrode; and forming a gate in the trench. The step of forming the separation structure at least includes: forming a covering portion, in which the covering portion covers the shielding electrode and the bottom insulating layer, and defines at least one recessed region; and forming a spacer portion in the at least one recessed region, in which the spacer portion includes a first barrier portion and a main filling portion, the main filling portion closes off the at least one recessed region, the first barrier portion is interposed between the covering portion and the main filling portion, and the main filling portion and the first barrier portion are respectively made of different materials.

Therefore, in the trench power semiconductor component and the method for manufacturing the same provided by the present disclosure, by virtue of the spacer portion of the separation structure that is located between the gate and the shielding electrode being disposed in the at least one recessed region and including the first barrier portion and the main filling portion, the first barrier portion being interposed between the main filling portion and the covering portion, the main filling portion closing off the at least one recessed region, and the main filling portion and the first barrier portion being respectively made of different materials, a leakage current between the gate and the shielding electrode can be reduced, and component reliability can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
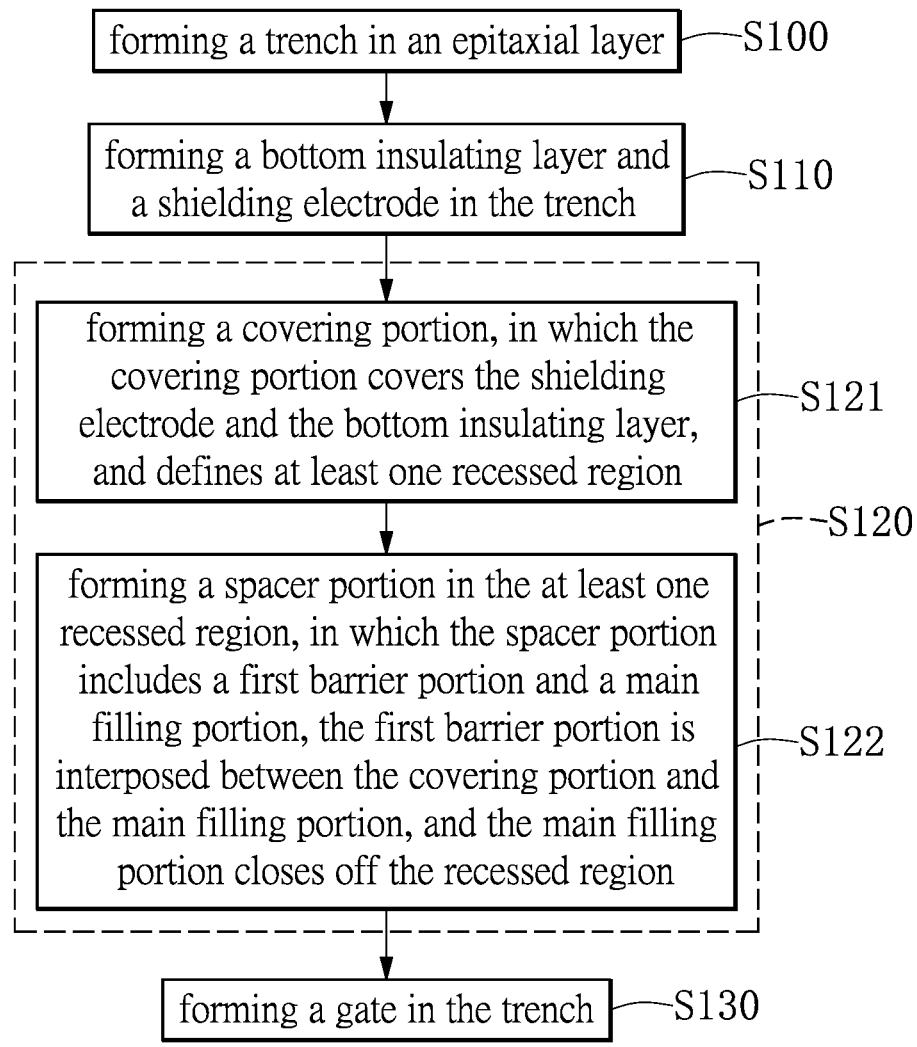
FIG. 1 is a flowchart of a method for manufacturing a trench power semiconductor component according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides a method for manufacturing a trench power semiconductor component, which can be used to manufacture at least one type of the trench power semiconductor component. The trench power semiconductor component can be a trench power transistor or other power semiconductor components. As shown in FIG. 1, the method for manufacturing the trench power semiconductor component at least includes the following steps: forming a trench in an epitaxial layer (step S100); forming a bottom insulating layer and a shielding electrode in the trench (step S110); forming a separation structure on the shielding electrode (step S120); and forming a gate in the trench (step S130).

Specifically, the step of forming the separation structure (step S120) further includes: forming a covering portion (step S121), in which the covering portion covers the shielding electrode and the bottom insulating layer, and defines at least one recessed region; and forming a spacer portion in the at least one recessed region (step S122), in which the spacer portion includes a first barrier portion and a main filling portion, the first barrier portion is interposed between the covering portion and the main filling portion, and the main filling portion closes off the recessed region. In the following description, the manufacturing process of the trench power semiconductor component of the first embodiment is taken as an example for illustrating specific details of each step.

Figure 2:
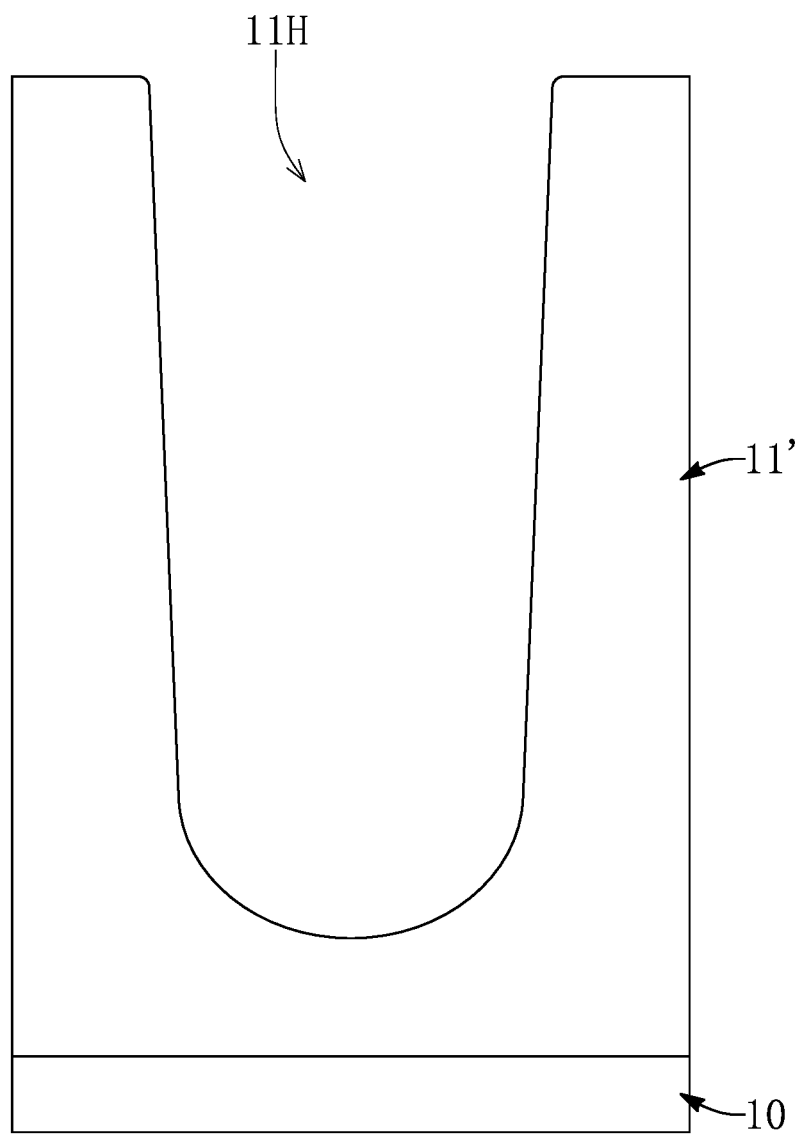
FIG. 2 is a schematic view of the trench power semiconductor component in step S100 according to a first embodiment of the present disclosure.

Referring to FIG. 2, which is to be read in conjunction with step S100 of FIG. 1, an epitaxial layer 11' has a trench 11H formed therein. It should be noted that, before this step, the epitaxial layer 11' can firstly be formed on a substrate 10. The substrate 10 contains conductive impurities in high concentration, so as to be used as a drain of the trench power semiconductor component. The above-mentioned conductive impurities can be N-type or P-type conductive impurities. Supposing that the substrate 10 is a silicon substrate, the N-type conductive impurities is a pentavalent ion (e.g., a phosphorus ion or an arsenic ion), and the P-type conductive impurities is a trivalent ion (e.g., a boron ion, an aluminum ion, or a gallium ion), if the trench power semiconductor component to be manufactured is an N-type trench power semiconductor component, the substrate 10 can be doped with the N-type conductive impurities. On the other hand, if the trench power semiconductor component to be manufactured is a P-type trench power semiconductor component, the substrate 10 can be doped with the P-type conductive impurities.

The epitaxial layer 11' and the substrate 10 have the same conductivity type, but the epitaxial layer 11' has a lower doping concentration. As shown in FIG. 2, the trench 11H is formed in the epitaxial layer 11'. The trench 11H extends downward from a surface of the epitaxial layer 11' to a position near the substrate 10. However, the trench 11H does not extend into the substrate 10.

Figure 3:
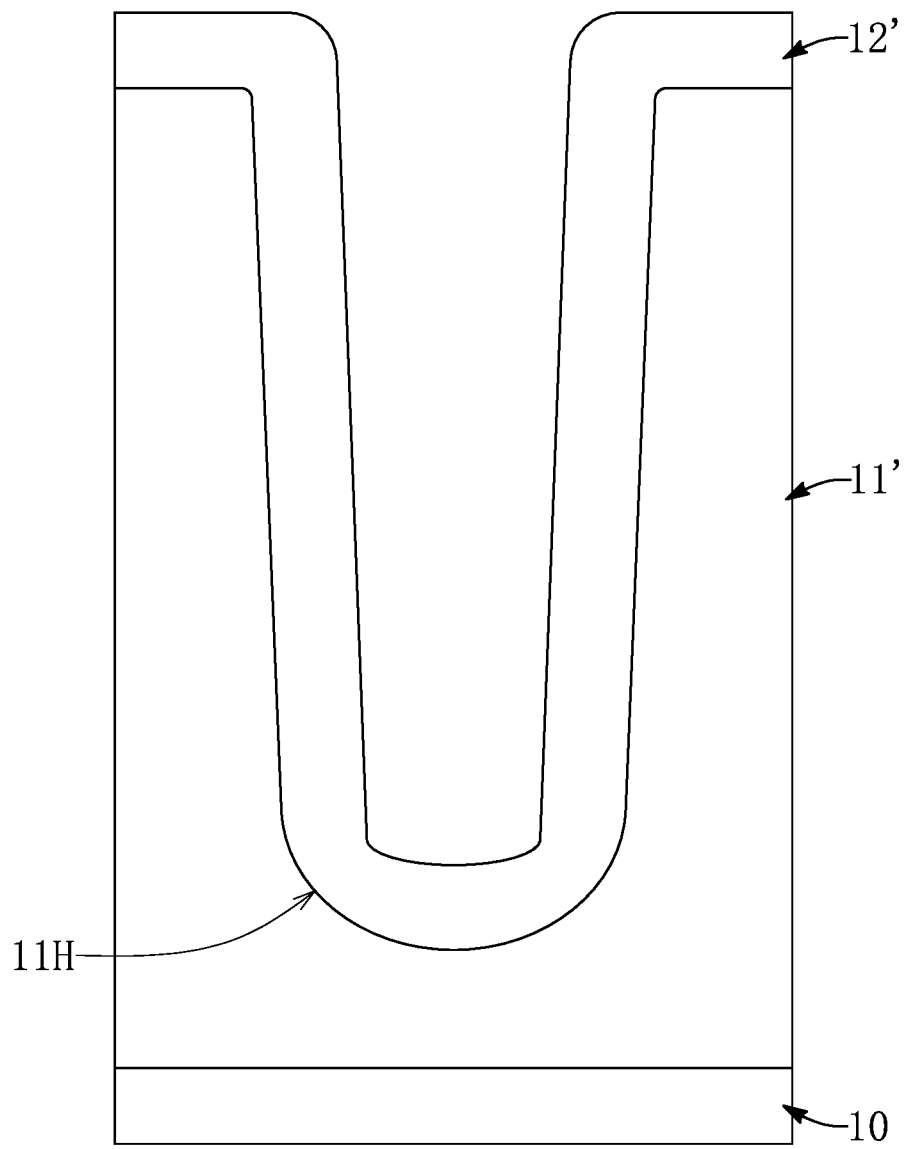
FIG. 3 is a schematic view of the trench power semiconductor component in a step of forming an initial bottom insulating layer according to the first embodiment of the present disclosure.
Figure 4:
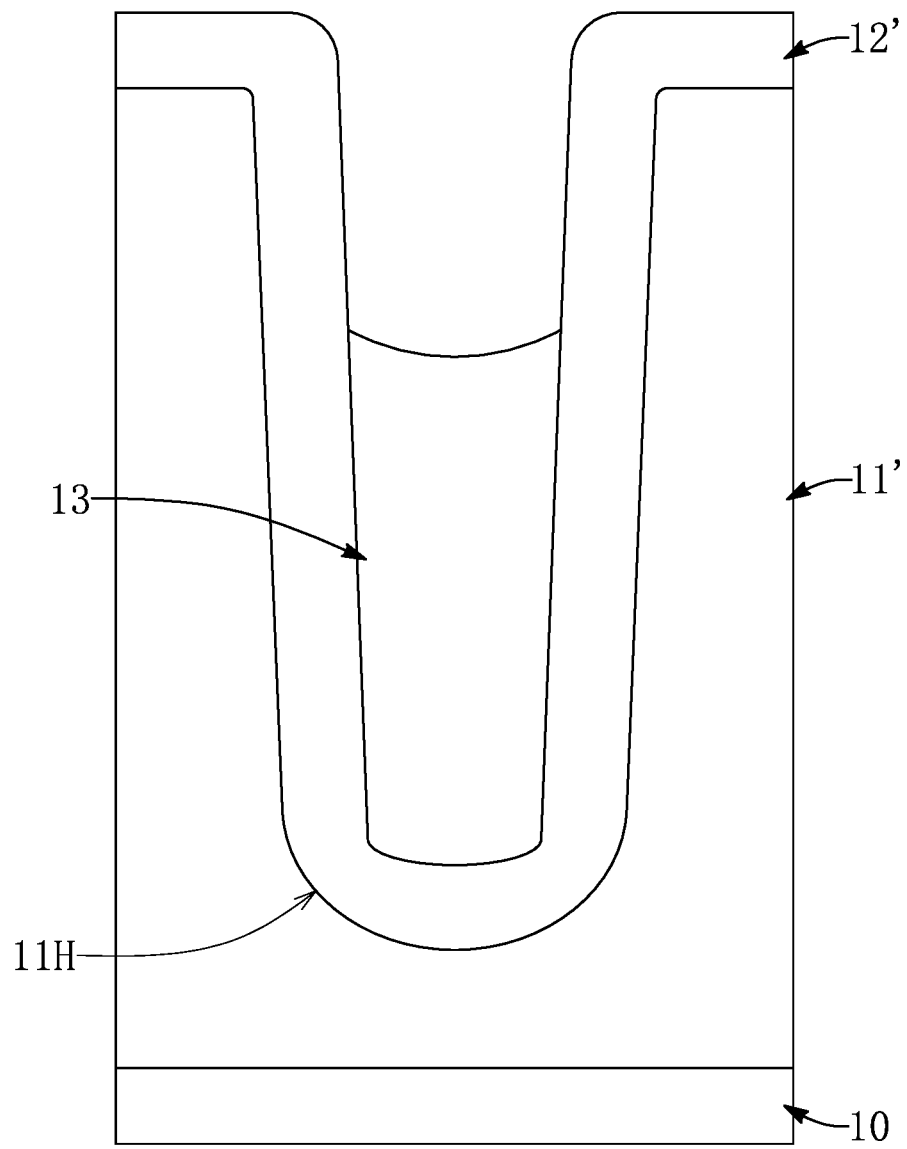
FIG. 4 is a schematic view of the trench power semiconductor component in a step of forming a shielding electrode according to the first embodiment of the present disclosure.
Figure 5:
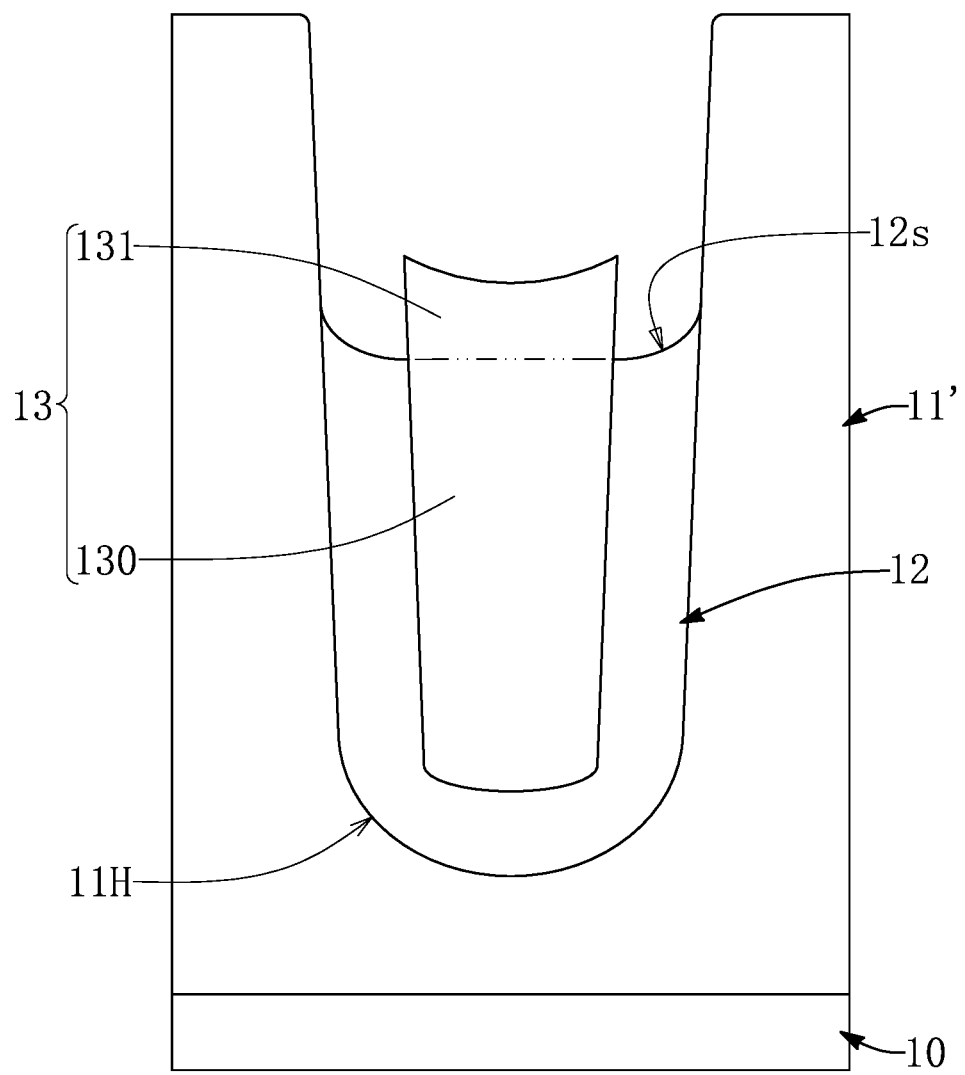
FIG. 5 is a schematic view of step S110 in the method according to one embodiment of the present disclosure.

Reference is made to FIG. 3 to FIG. 5, which are schematic views showing the trench power semiconductor component of the first embodiment in respective steps for formation of the bottom insulating layer and the shielding electrode. Specifically, as shown in FIG. 3, an initial bottom insulating layer 12' is formed in the trench 11H, and the initial bottom insulating layer 12' covers an inner wall surface of the trench 11H. A thickness of the initial bottom insulating layer 12' can be adjusted according to a withstand voltage that the trench power semiconductor component needs to sustain. In addition, the material by which the initial bottom insulating layer 12' is made of can be an oxide (e.g., silicon oxide) or other insulating materials. The initial bottom insulating layer 12' can be formed by, for example, thermal oxidation, physical vapor deposition, or chemical vapor deposition. However, the present disclosure is not limited thereto.

Referring to FIG. 4, a shielding electrode 13 is formed in the trench 11H. In one embodiment, heavily doped semiconductor materials can be repeatedly formed on the epitaxial layer 11' and be filled into the trench 11H. Then, the heavily doped semiconductor materials covering the surface of the epitaxial layer 11' are removed through an etching back process, so that the heavily doped semiconductor materials at a lower half of the trench 11H are retained and can be used to produce the shielding electrode 13. The above-mentioned heavily doped semiconductor materials can be polysilicon containing conductive impurities.

Reference is made to FIG. 5. By using the shielding electrode 13 as a mask, the initial bottom insulating layer 12' at an upper half of the trench 11H can be partially removed, so as to form a bottom insulating layer 12 at the lower half of the trench 11H. That is to say, the bottom insulating layer 12 covers a lower inner wall surface of the trench 11H.

Further, as shown in FIG. 5, one portion of the shielding electrode 13 protrudes from a top surface 12s of the bottom insulating layer 12. In the present embodiment, the portion of the shielding electrode 13 that protrudes from the bottom insulating layer 12 and that is not surrounded by the bottom insulating layer 12 is defined as a top portion 131. Another portion of the shielding electrode 13 that is embedded in the bottom insulating layer 12 is defined as a main body portion 130. The main body portion 130 of the shielding electrode 13 is enclosed by the bottom insulating layer 12, so as to be separated from the epitaxial layer 11'.

Figure 6:
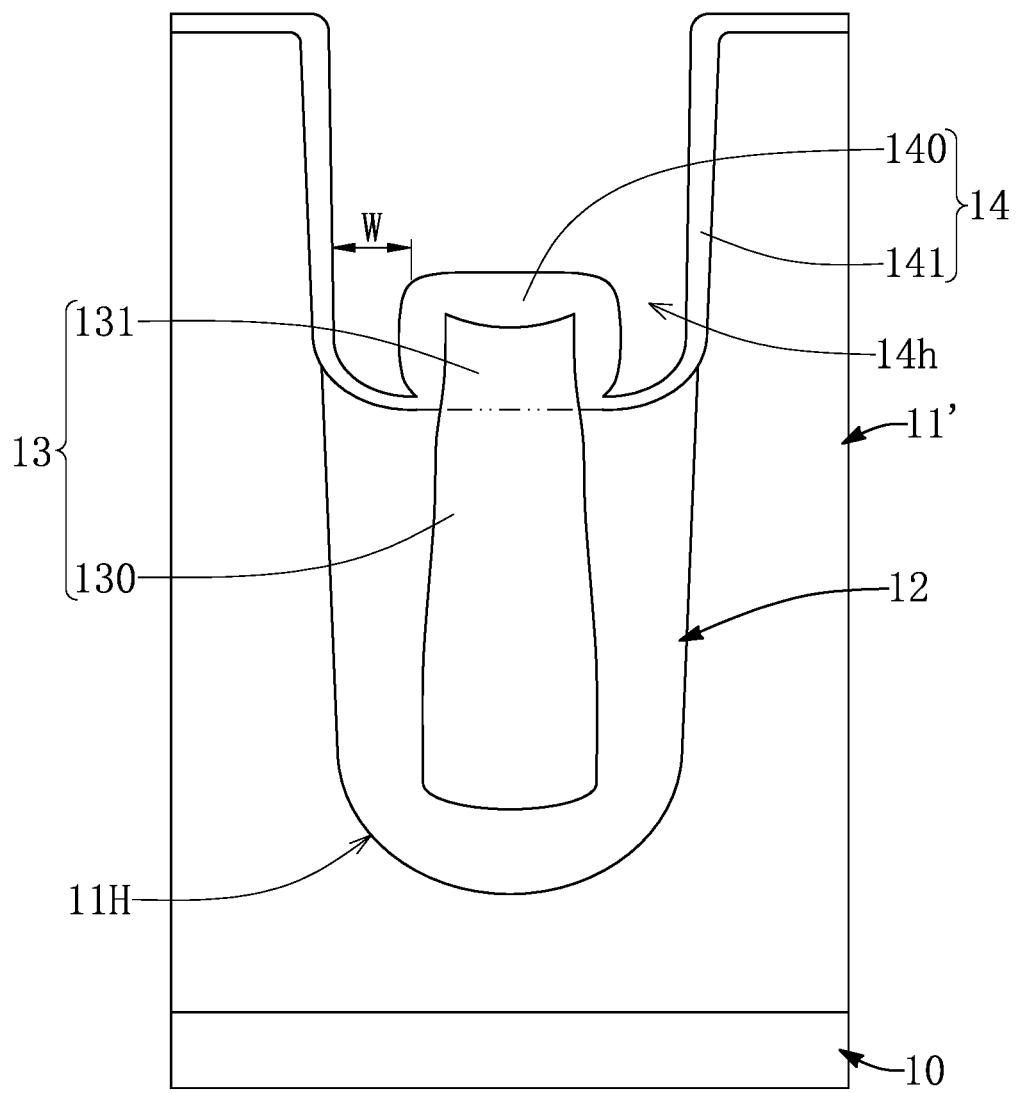
FIG. 6 is a schematic view of step S121 in the method according to one embodiment of the present disclosure.

Reference is made to FIG. 6 to FIG. 9, which are schematic views showing the trench power semiconductor component of the first embodiment in respective steps for formation of the separation structure in the shielding electrode. Referring to FIG. 6, which is to be read in conjunction with step S121 of FIG. 1, a dielectric layer 14 is formed for covering the top portion 131 of the shielding electrode 13. As shown in FIG. 6, the dielectric layer 14 further covers an upper inner wall surface of the trench 11H and the bottom insulating layer 12. In the present embodiment, through performing a thermal oxidation process, the upper inner wall surface of the trench 11H and the top portion 131 (not covered by the bottom insulating layer 12) of the shielding electrode 13 are simultaneously oxidized, so as to form the dielectric layer 14. Accordingly, the dielectric layer 14 of the present embodiment is a thermally-oxidized silicon layer, and different portions of the dielectric layer 14 have different thicknesses.

To be more specific, the dielectric layer 14 of the present embodiment includes a covering portion 140 and a side wall portion 141. The covering portion 140 covers the top portion 131 of the shielding electrode 13 and the bottom insulating layer 12, and the side wall portion 141 covers the upper inner wall surface of the trench 11H. During the thermal oxidation process, the top portion 131 of the shielding electrode 13 undergoes a greater degree of oxidation than the epitaxial layer 11'. As such, a thickness of the covering portion 140 located directly above the shielding electrode 13 is greater than a thickness of the side wall portion 141. In addition, a width of the upper half of the trench 11H is greater than a width of the lower half of the trench 11H. However, the present disclosure is not limited to the example above. In other embodiments, the dielectric layer 14 can also be formed by other deposition processes and have a more uniform thickness. In the present embodiment, after formation of the dielectric layer 14, a width of the top portion 131 of the shielding electrode 13 is less than a width of the main body portion 130.

It should be noted that the dielectric layer 14 defines at least one recessed region 14h in the trench 11H. More specifically, the covering portion 140 defines the above-mentioned recessed region 14h near the top portion 131 of the shielding electrode 13. In a cross-sectional view shown in FIG. 6, the recessed region 14h extends toward a side surface of the shielding electrode 13 in an inclined manner, such that a cross-sectional shape of the recessed region 14h is similar to that of a fang. Accordingly, a bottom end of the recessed region 14h is close to the shielding electrode 13, and is farther away from a side wall of the trench 11H.

Figure 7:
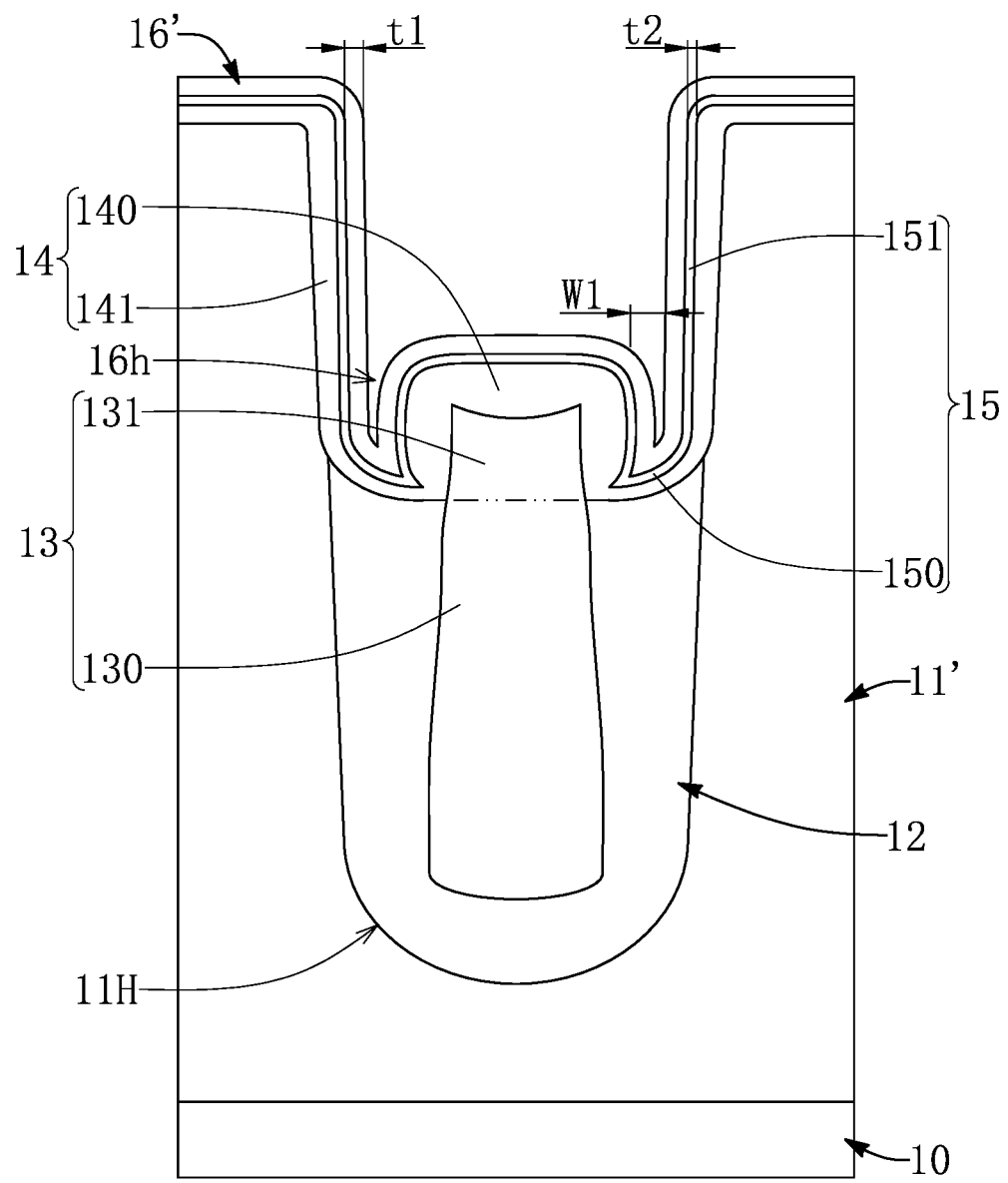
FIG. 7 is a schematic view of the trench power semiconductor component in a step of forming a barrier layer and a polysilicon layer according to the first embodiment of the present disclosure.
Figure 8:
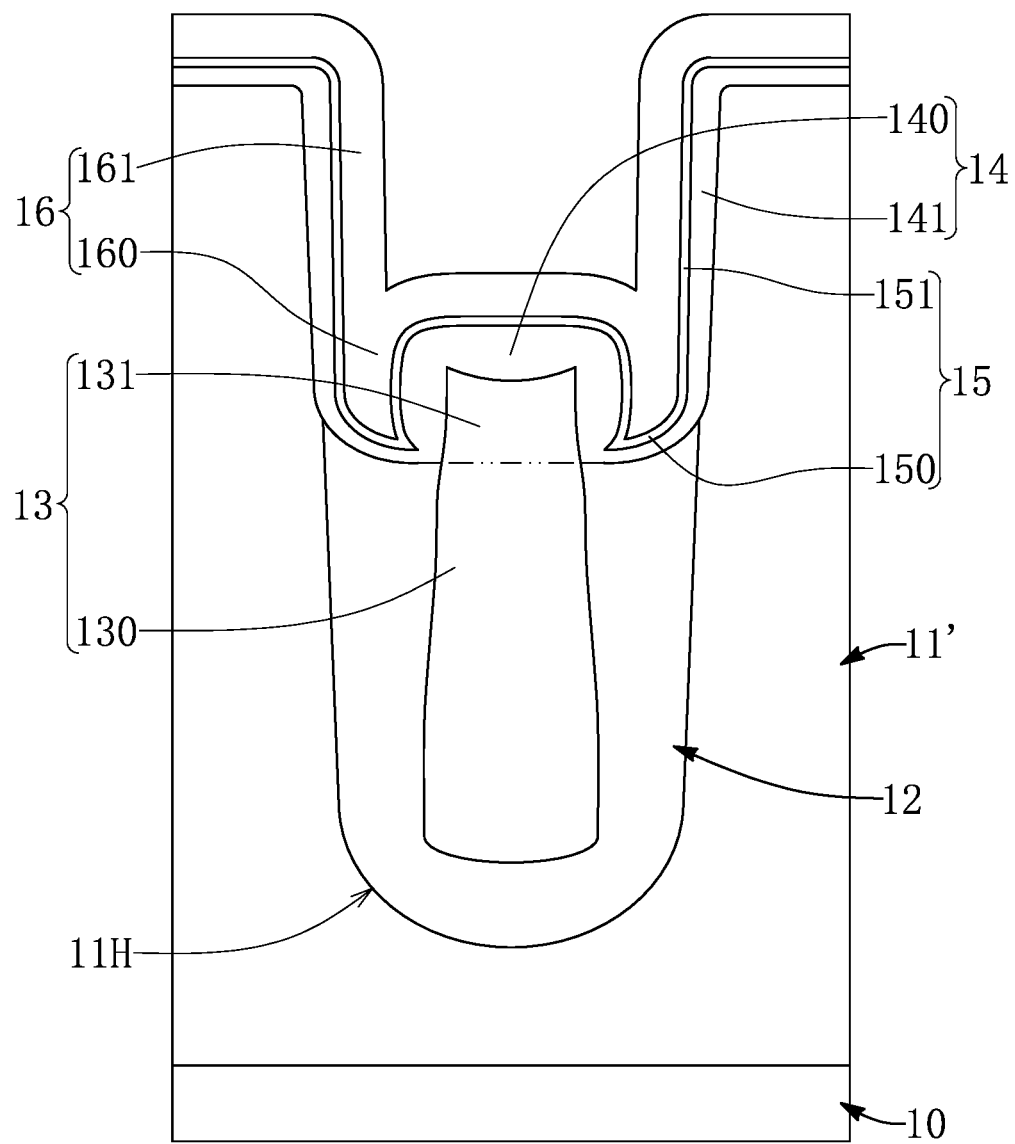
FIG. 8 is a schematic view of the trench power semiconductor component during a thermal oxidation process according to the first embodiment of the present disclosure.
Figure 9:
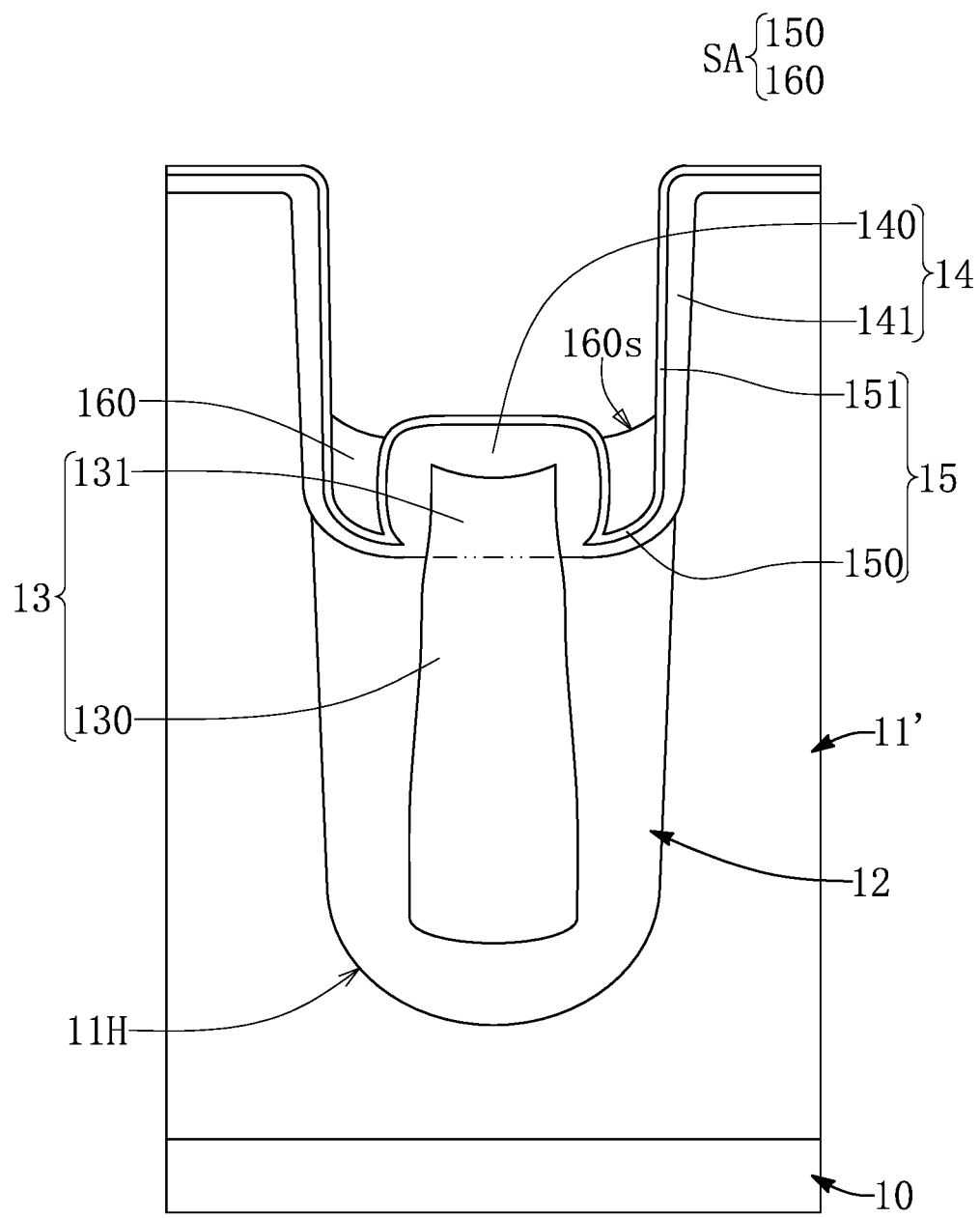
FIG. 9 is a schematic view of the trench power semiconductor component in a step of partially removing a thermal oxide layer according to the first embodiment of the present disclosure.

It is worth mentioning that by filling the recessed region 14h, a leakage current can be reduced and component reliability can be improved in the embodiment of the present disclosure. Reference is made to FIG. 7 to FIG. 9, which are schematic views showing the trench power semiconductor component of the first embodiment in respective steps for formation of a barrier layer and the main filling portion. As shown in FIG. 7, a barrier layer 15 matches the contours of and covers the surface of the epitaxial layer 11', the upper inner wall surface of the trench 11H, and the covering portion 140 of the dielectric layer 14. Accordingly, the barrier layer 15 at least includes a first barrier portion 150 in the recessed region 14h and a second barrier portion 151 covering the side wall portion 141 of the dielectric layer 14 (and the upper inner wall surface of the trench 11H).

After formation of the barrier layer 15, a polysilicon layer 16' that completely covers the barrier layer 15 is formed. As such, the barrier layer 15 is interposed between the polysilicon layer 16' and the dielectric layer 14. The polysilicon layer 16' can be an undoped polysilicon layer (i.e., intrinsic polysilicon layer) or a doped polysilicon layer, but the present disclosure is not limited thereto. In addition, as shown in FIG. 7, while a portion of the polysilicon layer 16' is disposed in the recessed region 14h, the recessed region 14h is not closed off by the portion of the polysilicon layer 16', so as to define an opening 16h.

It should be noted that in subsequent steps, the polysilicon layer 16' will be oxidized to fill out the recessed region 14h. Hence, through formation of the barrier layer 15 that covers the surface of the epitaxial layer 11' and the upper inner wall surface of the trench 11H, the epitaxial layer 11' can be prevented from continuous oxidation in the subsequent steps (which can increase a threshold voltage of the trench power semiconductor component and affect electrical performance of said component). In one embodiment, the material by which the barrier layer 15 is made of is nitride or nitrogen oxide, such as silicon nitride or silicon oxynitride. However, the present disclosure is not limited thereto.

In addition, a thickness t1 of the polysilicon layer 16' and a thickness t2 of the barrier layer 15 are controlled, so as to prevent the polysilicon layer 16' and the barrier layer 15 from closing the opening 16h. For example, a sum of the thickness t2 of the barrier layer 15 and the thickness t1 of the polysilicon layer 16' is less than a maximum width W of the at least one recessed region 14h along a horizontal direction (as shown in FIG. 6 and FIG. 7). In one embodiment, the thickness t1 of the polysilicon layer 16', the thickness t2 of the barrier layer 15, and the maximum width W of the recessed region 14h along the horizontal direction satisfy the following relation: $W>2\times(t1+t2)$.

The opening 16h defined by the polysilicon layer 16' has a maximum width W1 along the horizontal direction. Further, through controlling a ratio between the maximum width W1 of the opening 16h along the horizontal direction and the thickness t1 of the polysilicon layer 16', the recessed region 14h can be completely closed after performing the thermal oxidation process on the polysilicon layer 16'.

Referring to FIG. 7 and FIG. 8, the thermal oxidation process is performed on the polysilicon layer 16', so that a thermal oxide layer 16 is formed due to oxidation of the polysilicon layer 16'. One portion of the thermal oxide layer 16 is filled into the at least one recessed region 14h, so as to form a main filling portion 160. Another portion 161 of the thermal oxide layer 16 covers the second barrier portion 151 of the barrier layer 15 (that is, covers the upper inner wall surface of the trench 11H).

It should be noted that due to limitations in manufacturing conditions, the polysilicon layer 16' at a bottom of the recessed region 14h may not be completely oxidized. Therefore, in one embodiment, the material by which the main filling portion 160 is made of can include silicon oxide and polysilicon, and the polysilicon is enclosed by the silicon oxide. Since the polysilicon is embedded in the silicon oxide and is separated from the gate, the electrical performance of the trench power semiconductor component will not be affected. In another embodiment, after an oxidation process, the polysilicon layer 16' at the bottom of the recessed region 14h may not be able to merge properly, such that holes are present in the main filling portion 160. However, the main filling portion 160 can still completely close the recessed region 14h. That is to say, the holes inside the main filling portion 160 are also separated from the gate, and will not affect the electrical performance of the trench power semiconductor component. Accordingly, even though unoxidized polysilicon or holes may form inside the recessed region 14h due to limitations in the manufacturing conditions, a normal operation of the component will not be affected.

Referring to FIG. 9, the thermal oxide layer 16 is partially removed, and the main filling portion 160 in the recessed region 14h is retained. As such, the portion 161 of the thermal oxide layer 16 that covers the upper inner wall surface of the trench 11H and a portion that is located directly above the shielding electrode 13 are also removed. In other words, with the exception of the main filling portion 160 in the recessed region 14h, other parts of the thermal oxide layer 16 will be removed. In one embodiment, the thermal oxide layer 16 can be partially removed by performing a selective etching process. During the selective etching process, the barrier layer 15 is still retained and is not removed. Accordingly, the first barrier portion 150 in the recessed region 14h and the main filling portion 160 jointly form a spacer portion SA that fills the recessed region 14h. Through the above-mentioned steps, the separation structure (not labeled) located above the shielding electrode 13 can be formed inside the trench 11H. The separation structure at least includes the covering portion 140, the first barrier portion 150, and the main filling portion 160.

In the present embodiment, an upper surface 160s of the main filling portion 160 extends from the second barrier portion 151 toward the top portion 131 of the shielding electrode 13 in an inclined manner (as shown in FIG. 9). In one embodiment, the upper surface 160s of the main filling portion 160 is an inclined curved surface.

Figure 10:
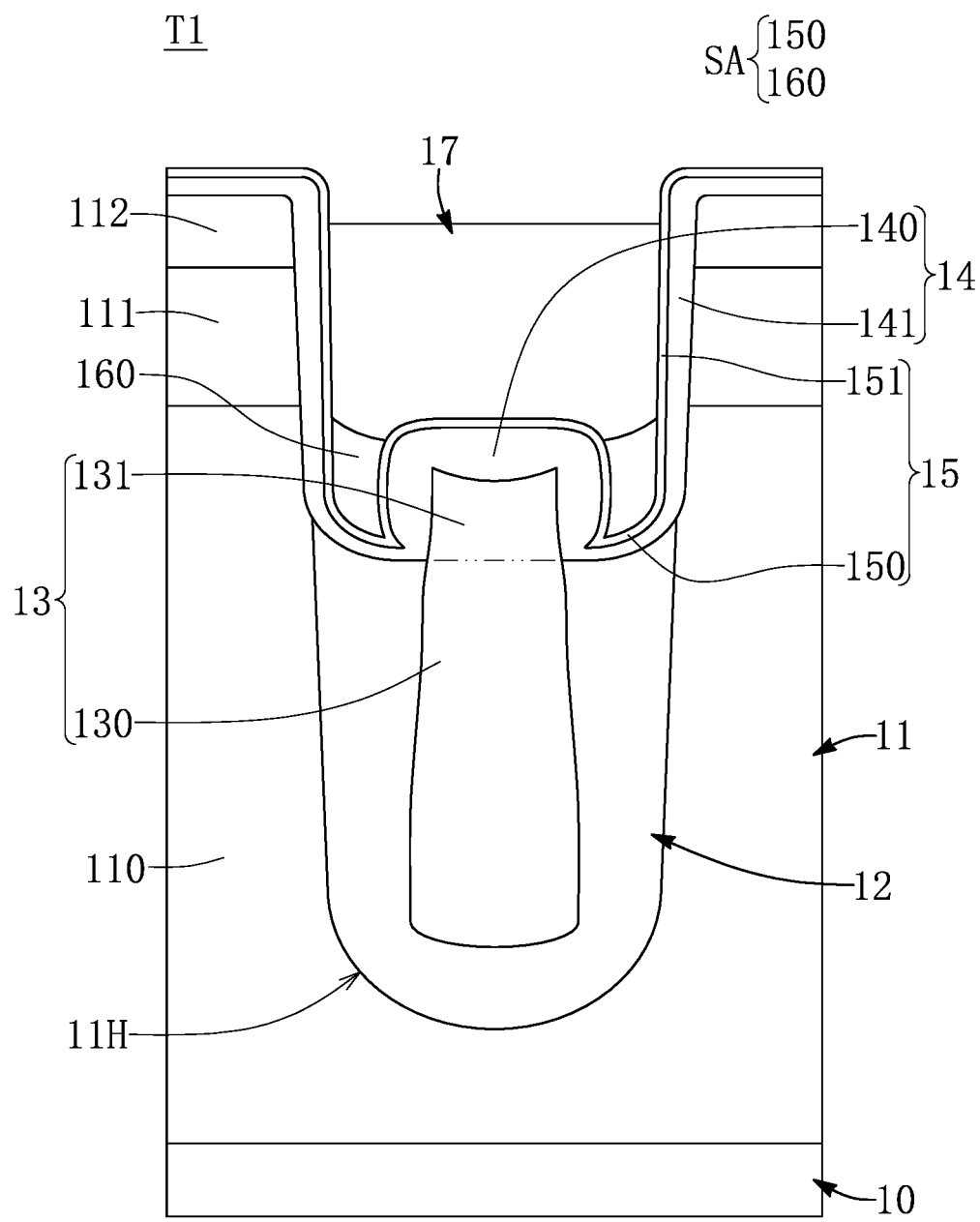
FIG. 10 is a schematic cross-sectional view of the trench power semiconductor component according to the first embodiment of the present disclosure.

Referring to FIG. 10, which is to be read in conjunction with step S130 of FIG. 1, a gate 17 is formed in the trench 11H. The gate 17 is disposed on the separation structure, and is separated from the shielding electrode 13. It is worth mentioning that since the upper surface 160s of the main filling portion 160 in the present embodiment is the inclined curved surface, a bottom of the gate 17 has a curved surface to cooperate with the upper surface 160s of the main filling portion 160. Therefore, electric charges do not easily accumulate at the bottom of the gate 17 (which can increase an electric field strength).

In addition, by doping conductive impurities of different concentrations and different types in different regions, an epitaxial layer 11 can be divided into a drift region 110, a base region 111, and a source region 112. The base region 111 and the source region 112 are formed in the epitaxial layer 11 at a side of the trench 11H (which is an upper half of the epitaxial layer 11), and the source region 112 is located above the base region 111. The drift region 110 is located at a side of the epitaxial layer 11 that is adjacent to the substrate 10 (i.e., located at a lower half of the epitaxial layer 11).

Specifically, the base region 111 and the substrate 10 have different conductivity types, and the source region 112 and the substrate 10 have the same conductivity type. Compared with the base region 111, the source region 112 and the substrate 10 have a higher doping concentration. For example, when a trench power semiconductor component T1 is an N-type trench power transistor, the base region 111 is doped with the P-type conductive impurities (e.g., a P-well). A portion of the epitaxial layer 11 that is not further doped (i.e., a region that is located below the base region 111) is defined as the drift region 110 of the trench power semiconductor component T1.

Furthermore, the trench power semiconductor component T1 of the present embodiment includes the epitaxial layer 11, the bottom insulating layer 12, a gate insulating layer, the shielding electrode 13, the gate 17, and the separation structure. The epitaxial layer 11 has the trench 11H, and the bottom insulating layer 12, the gate insulating layer, the shielding electrode 13, the gate 17, and the separation structure are located inside the trench 11H. The bottom insulating layer 12 covers the lower inner wall surface of the trench 11H, and the gate insulating layer covers the upper inner wall surface of the trench 11H.

The shielding electrode 13 is disposed in the trench 11H, and is separated from the epitaxial layer 11 by the bottom insulating layer 12. Specifically, the shielding electrode 13 can be divided into the top portion 131 and the main body portion 130. The top portion 131 protrudes from the bottom insulating layer 12. The main body portion 130 is enclosed by the bottom insulating layer 12, and is separated from the epitaxial layer 11.

The gate 17 is disposed on the shielding electrode 13, and is separated from the epitaxial layer 11 by the gate insulating layer. In the present embodiment, the side wall portion 141 covering the upper inner wall surface of the trench 11H and the second barrier portion 151 jointly form the gate insulating layer, but the present disclosure is not limited thereto.

In the embodiment of the present disclosure, by having the shielding electrode 13 disposed at a bottom of the trench 11H, a gate-to-drain capacitance (Cgd) can be lowered, thereby reducing work loss and increasing a voltage conversion efficiency of the trench power semiconductor component T1 during operation. Furthermore, the shielding electrode 13 is electrically connected to a source, so that a charge balance can be achieved in the drift region 110 and a breakdown voltage can be further increased. Accordingly, an impurity doping concentration of the drift region 110 can be relatively increased, so as to reduce an on-resistance in the drift region 110.

The separation structure is disposed between the gate 17 and the shielding electrode 13, and includes the covering portion 140 and the spacer portion SA. As shown in FIG. 10, the covering portion 140 covers the top portion 131 of the shielding electrode 13 and the bottom insulating layer 12, and is connected to the gate insulating layer. The covering portion 140 defines the at least one recessed region 14h (two of which are exemplified in FIG. 10), and the recessed region 14h is located beside the top portion 131 of the shielding electrode 13. Further, the bottom end of the recessed region 14h is closer to the shielding electrode 13, and is farther away from the side wall of the trench 11H.

The spacer portion SA is in the recessed region 14h, and includes the first barrier portion 150 of the barrier layer 15 and the main filling portion 160. The first barrier portion 150 is interposed between the main filling portion 160 and the covering portion 140, and the main filling portion 160 and the first barrier portion 150 are respectively made of different materials. Specifically, the first barrier portion 150 is formed on and matches the contour of an inner surface of the recessed region 14h. The main filling portion 160 is filled into the remaining space of the recessed region 14h, and completely closes off an opening end of the recessed region 14h.

As mentioned previously, the material by which the main filling portion 160 is made of can include silicon oxide only, but can also include silicon oxide and polysilicon. When the material by which the main filling portion 160 is made of includes the silicon oxide and the polysilicon, the polysilicon is embedded in the silicon oxide and is separated from the gate 17. In addition, in the present embodiment, apart from the first barrier portion 150 and the second barrier portion 151, the barrier layer 15 further includes one portion that is located between the gate 17 and the covering portion 140.

Based on the above, the spacer portion SA is filled into the recessed region 14h, so as to prevent the gate 17 from forming a sharp protrusion at the bottom thereof. In this way, the electric field strength between the gate 17 and the shielding electrode 13 can be reduced, the withstand voltage between the gate 17 and the shielding electrode 13 can be increased, and the leakage current between the gate 17 and the shielding electrode 13 can be lowered. However, the aforementioned examples describe only one of the embodiments of the present disclosure, and should not be taken as limiting the scope of the present disclosure.

Second Embodiment

Figure 11:
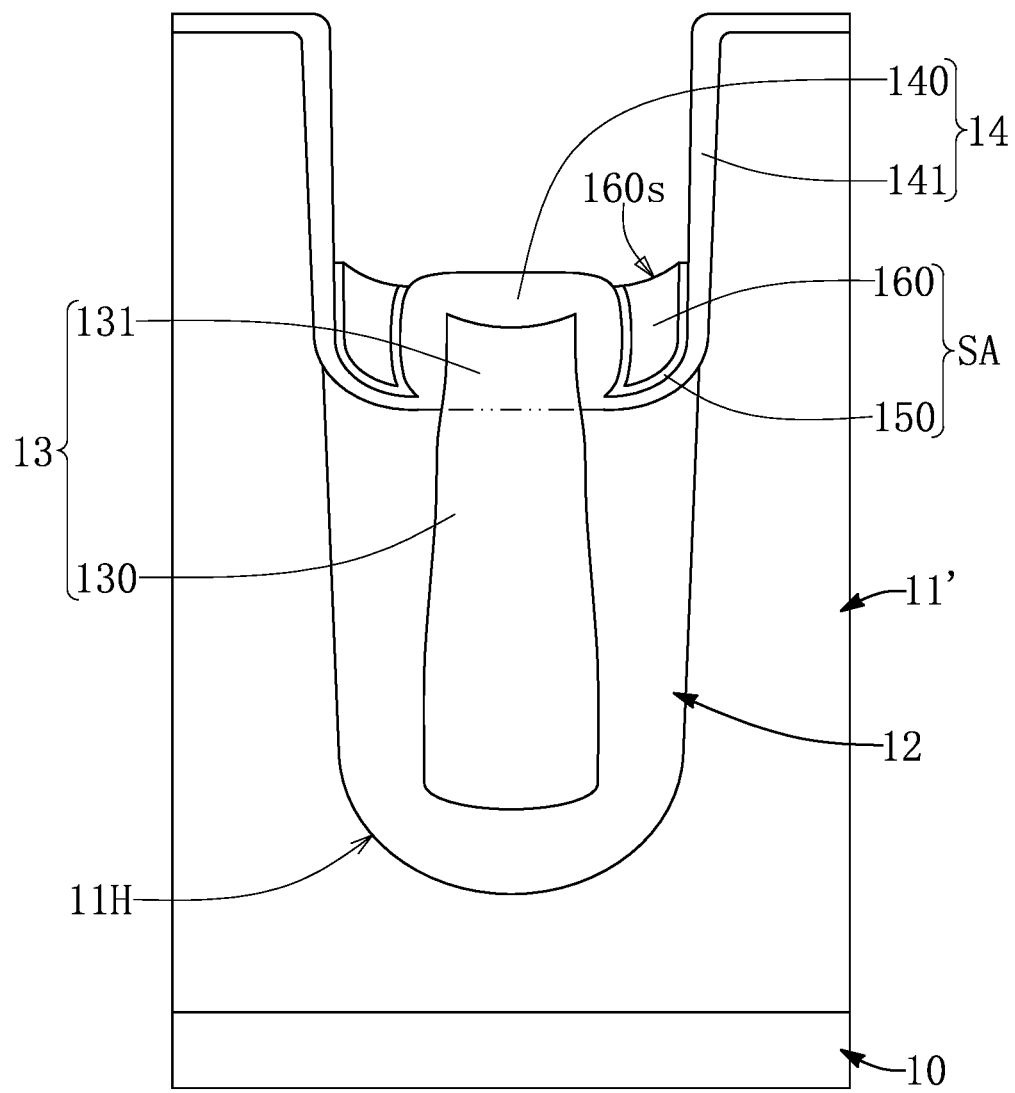
FIG. 11 is a schematic view of the trench power semiconductor component in a step of partially removing the barrier layer according to a second embodiment of the present disclosure.

Reference is made to FIG. 11, which is a schematic view of the trench power semiconductor component in a step of partially removing the barrier layer according to a second embodiment of the present disclosure. Elements of the present embodiment that are the same or similar to those of the first embodiment are labeled with the same or similar reference numerals, and the similarities will not be reiterated herein.

FIG. 11 is a continuation of the step shown in FIG. 9. That is, after the step of partially removing the thermal oxide layer, the barrier layer 15 is partially removed. To be more specific, the second barrier portion 151 of the barrier layer 15 and a portion located above the covering portion 140 can be removed, and the first barrier portion 150 in the recessed region 14h is retained.

Figure 12:
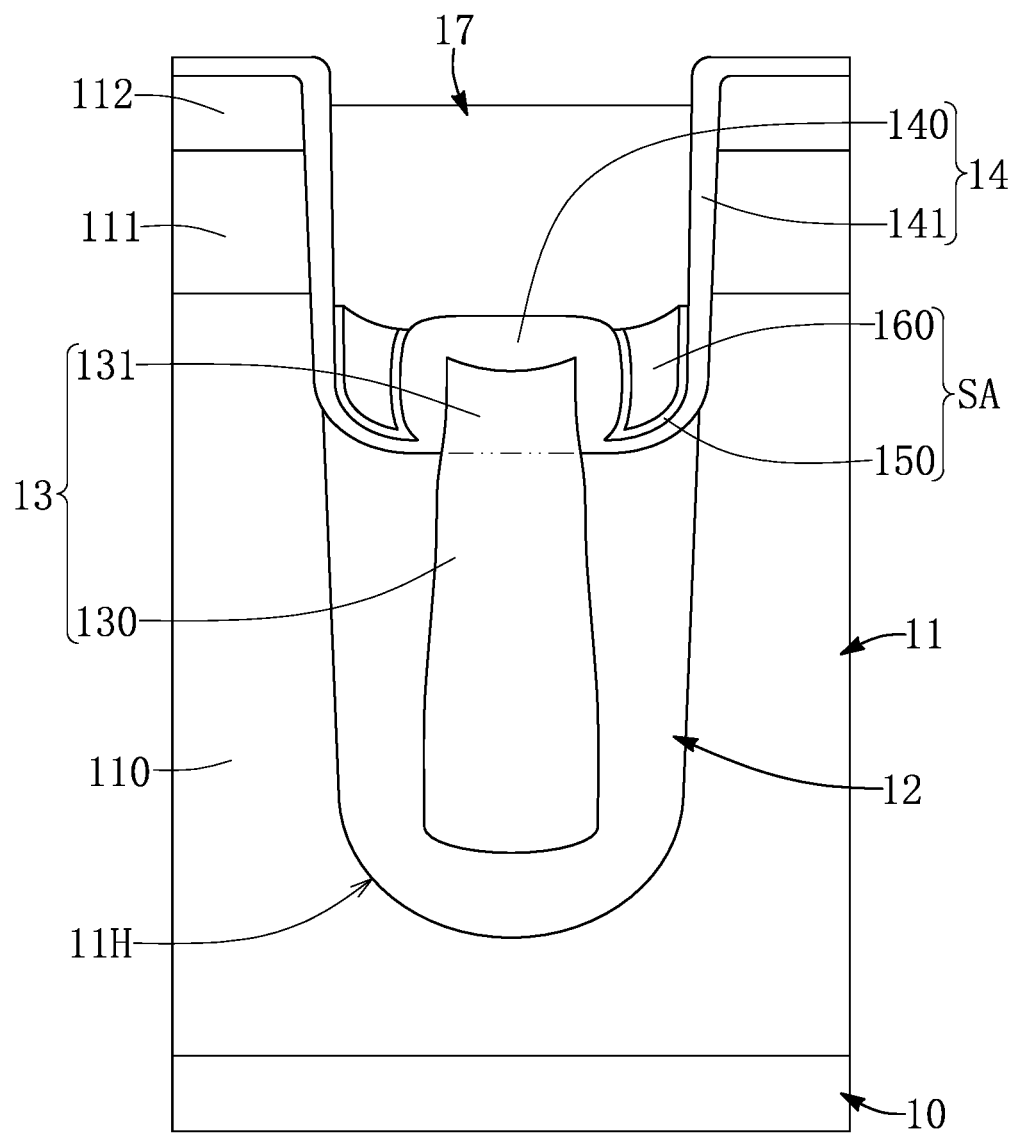
FIG. 12 is a schematic cross-sectional view of the trench power semiconductor component according to the second embodiment of the present disclosure.

Reference is made to FIG. 12, in which the gate 17 is formed, and the base region 111 and the source region 112 are formed in the epitaxial layer 11, so as to form a trench power semiconductor component T2 of the second embodiment in the present disclosure. In the present embodiment, since the second barrier portion 151 of the barrier layer 15 and the portion located above the covering portion 140 are removed, the gate insulating layer only includes the side wall portion 141 of the dielectric layer 14. In addition, the gate 17 is directly connected to the covering portion 140.

Compared with the trench power semiconductor component T1 of the first embodiment, a thickness of the gate insulating layer in the present embodiment is smaller. However, in the trench power semiconductor component T2 of the present embodiment, the gate 17 can still be prevented from shaping the sharp protrusion at the bottom thereof, so as to increase the withstand voltage between the gate 17 and the shielding electrode 13, and lower the leakage current therebetween.

Third Embodiment

Figure 13:
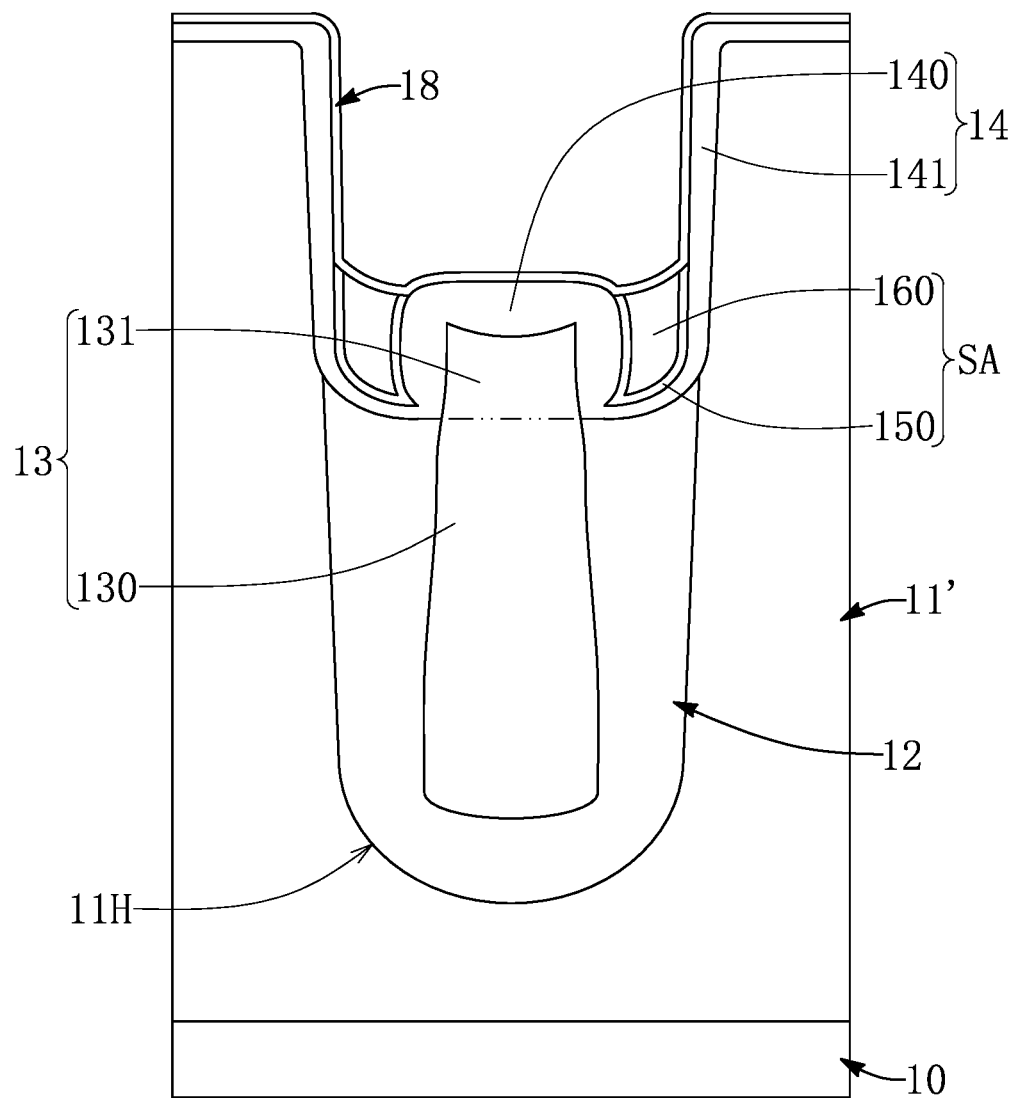
FIG. 13 is a schematic view of the trench power semiconductor component in a step of forming an insulating layer according to a third embodiment of the present disclosure.

Reference is made to FIG. 13, which is a schematic view of the trench power semiconductor component in a step of forming an insulating layer according to a third embodiment of the present disclosure. Elements of the present embodiment that are the same or similar to those of the second embodiment are labeled with the same or similar reference numerals, and the similarities will not be reiterated herein.

FIG. 13 is a continuation of the step shown in FIG. 11. That is, after the step of partially removing the barrier layer 15, a repair layer 18 is further formed in the trench 11H. The repair layer 18 covers an inner surface of the gate insulating layer and an upper surface of the separation structure, and surrounds the gate 17. The side wall portion 141 of the dielectric layer 14 is likely to have deficiencies due to removal of the second barrier portion 151 of the barrier layer 15, and these deficiencies may affect the electrical performance of a component. Therefore, through forming the repair layer 18 that covers the side wall portion 141, the deficiencies of the side wall portion 141 can be fixed, so as to avoid affecting the electrical performance of the component. In the present embodiment, the repair layer 18 further covers the separation structure formed in the previous step (i.e., covering the spacer portion SA and the covering portion 140 of the dielectric layer 14). In one embodiment, the repair layer 18 and the side wall portion 141 are made of the same material, e.g., silicon oxide.

Figure 14:
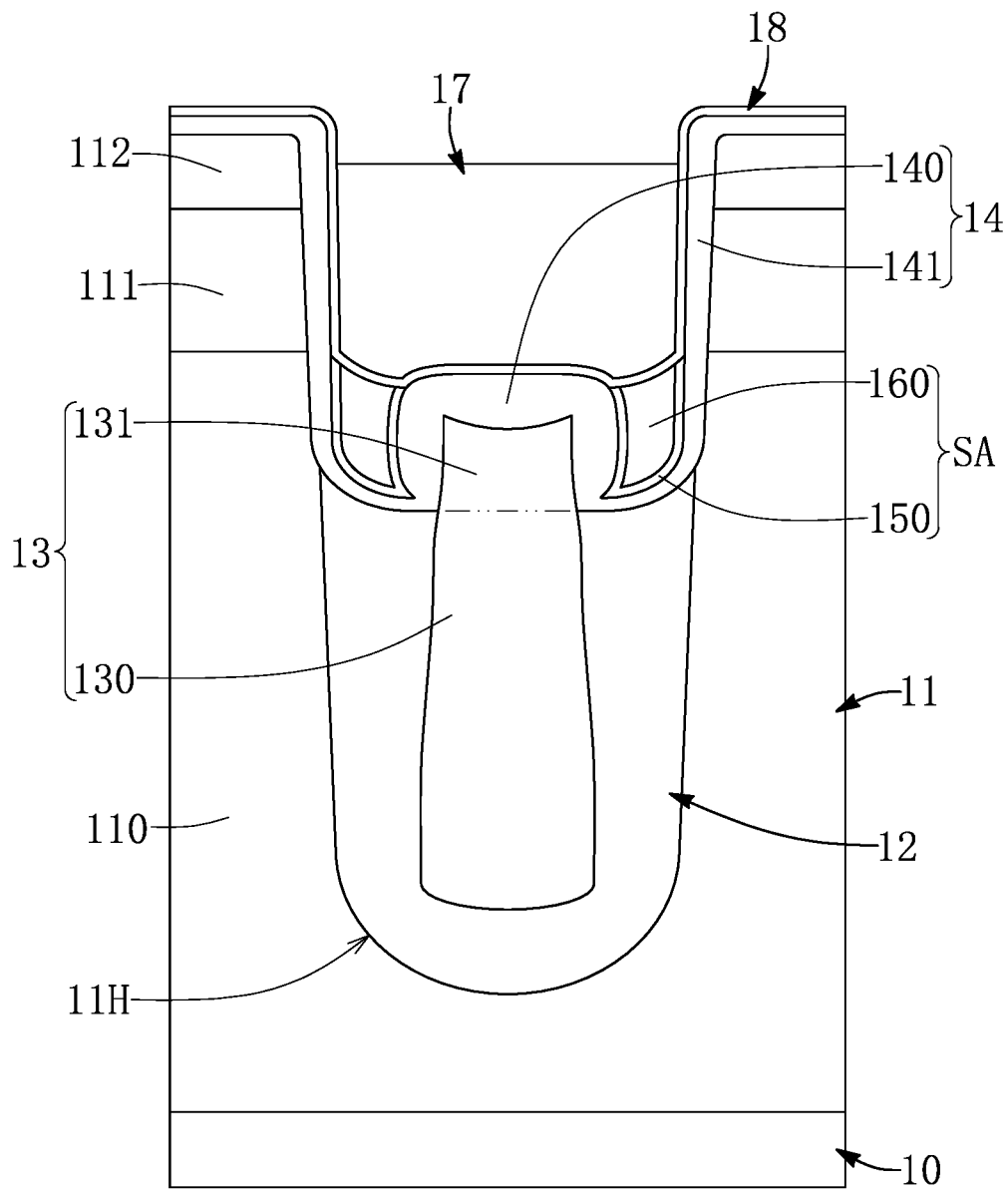
FIG. 14 is a schematic cross-sectional view of the trench power semiconductor component according to the third embodiment of the present disclosure.

Reference is made to FIG. 14. The gate 17 is formed, and the base region 111 and the source region 112 are formed in the epitaxial layer 11, so as to form a trench power semiconductor component T3 of the third embodiment in the present disclosure. In the present embodiment, the second barrier portion 151 of the barrier layer 15 and the portion located above the covering portion 140 are removed. Accordingly, the gate insulating layer can include the side wall portion 141 of the dielectric layer 14 and the repair layer 18. In addition, a bottom surface of the gate 17 is directly connected to the repair layer 18.

Compared with the trench power semiconductor component T2 of the second embodiment, the gate insulating layer in the trench power semiconductor component T3 of the present embodiment has fewer deficiencies, so that the leakage current between the gate 17 and the drain can be avoided and operation of the trench power semiconductor component T3 will not be affected. Further, in the trench power semiconductor component T3 of the present embodiment, the gate 17 can still be prevented from having the sharp protrusion formed at the bottom thereof, so as to increase the withstand voltage between the gate 17 and the shielding electrode 13 and lower the leakage current therebetween.

Beneficial Effects of the Embodiments

In conclusion, in the trench power semiconductor component and the method for manufacturing the same provided by the present disclosure, by virtue of the separation structure disposed between the gate 17 and the shielding electrode 13 including the covering portion 140 and the spacer portion SA, the covering portion 140 defining the at least one recessed region 14h, the spacer portion SA being disposed in the at least one recessed region 14h and including the first barrier portion 150 and the main filling portion 160, the main filling portion 160 closing off the at least one recessed region 14h, the first barrier portion 150 being interposed between the dielectric layer 14 (or the covering portion 140) and the main filling portion 160, and the main filling portion 160 and the barrier layer 15 being respectively made of different materials, the withstand voltage between the gate 17 and the shielding electrode 13 can be increased and the leakage current between the gate 17 and the shielding electrode 13 can be lowered, thereby improving reliability of the trench power semiconductor components T1 to T3.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A trench power semiconductor component, comprising:
an epitaxial layer having at least one trench;
a bottom insulating layer covering a lower inner wall surface of the at least one trench;
a gate insulating layer covering an upper inner wall surface of the at least one trench;
a shielding electrode disposed in the at least one trench, wherein the bottom insulating layer surrounds the shielding electrode;
a gate disposed on the shielding electrode and separated from the epitaxial layer by the gate insulating layer; and
a separation structure disposed between the gate and the shielding electrode, wherein the separation structure includes:
a covering portion covering a top portion of the shielding electrode and the bottom insulating layer, wherein the covering portion is connected to the gate insulating layer, and defines at least one recessed region; and
a spacer portion disposed in the at least one recessed region and including a first barrier portion and a main filling portion, wherein the first barrier portion is interposed between the main filling portion and the covering portion, the main filling portion filled in the at least one recessed region, and the main filling portion and the first barrier portion are respectively made of different materials;
wherein the gate insulating layer includes a side wall portion, and the side wall portion and the covering portion are connected to each other and are made of a same material; and
wherein the gate insulating layer further includes a second barrier portion, the side wall portion is disposed between the second barrier portion and the upper inner wall surface of the at least one trench, and the second barrier portion and the first barrier portion are connected to each other and are made of a same material.

2. The trench power semiconductor component according to claim 1, wherein a material by which the covering portion and the main filling portion are made of is silicon oxide, and a material by which the first barrier portion is made of is nitride or nitrogen oxide.

3. The trench power semiconductor component according to claim 1, wherein a material by which the main filling portion is made of includes silicon oxide and polysilicon, and the polysilicon is embedded in the silicon oxide and is separated from the gate.

4. The trench power semiconductor component according to claim 1, wherein the gate insulating layer further includes a repair layer, the repair layer covers surfaces of the side wall portion, the covering portion, and the main filling portion, and the repair layer and the side wall portion are made of a same material.

5. A method for manufacturing a trench power semiconductor component, comprising:
forming a trench in an epitaxial layer;
forming a bottom insulating layer and a shielding electrode in the trench, wherein the bottom insulating layer covers a lower inner wall surface of the trench, and a top portion of the shielding electrode protrudes from a top surface of the bottom insulating layer;
forming a separation structure on the shielding electrode, wherein the step of forming the separation structure at least includes:
forming a covering portion, wherein the covering portion covers the shielding electrode and the bottom insulating layer, and defines at least one recessed region; and
forming a spacer portion in the at least one recessed region, wherein the spacer portion includes a first barrier portion and a main filling portion, the main filling portion filled in the at least one recessed region, the first barrier portion is interposed between the covering portion and the main filling portion, and the main filling portion and the first barrier portion are respectively made of different materials; and
forming a gate in the trench;

wherein the gate includes a gate insulating layer on an upper inner wall surface of the trench and on the separation structure;

wherein the gate insulating layer includes a side wall portion, and the side wall portion and the covering portion are connected to each other and are made of a same material; and wherein the gate insulating layer further includes a second barrier portion, the side wall portion is disposed between the second barrier portion and the upper inner wall surface of the trench, and the second barrier portion and the first barrier portion are connected to each other and are made of a same material.

6. The method according to claim 5, wherein a material by which the covering portion and the main filling portion are made of is silicon oxide, and a material by which the barrier layer is made of is nitride or nitrogen oxide.

* * * * *